United States Patent [19]

Vanselow

[11] Patent Number: 5,692,016
[45] Date of Patent: Nov. 25, 1997

[54] PROCESS AND ARRANGEMENT FOR ADJUSTING THE LOCAL OSCILLATORS OF A RECEIVER IN A MULTI-CHANNEL TRANSMISSION SYSTEM

[75] Inventor: Frank Vanselow, Dormitz, Germany

[73] Assignee: Grundig E.M.V. Elektromechanische Versuchsanstalt Max Grundig GmbH Co. KG, Fuerth, Germany

[21] Appl. No.: 557,073
[22] PCT Filed: Apr. 13, 1994
[86] PCT No.: PCT/EP94/01139
 § 371 Date: Dec. 7, 1995
 § 102(e) Date: Dec. 7, 1995
[87] PCT Pub. No.: WO94/29984
 PCT Pub. Date: Dec. 22, 1994

[30] Foreign Application Priority Data

Jun. 15, 1993 [DE] Germany ............... 43 19 769.8

[51] Int. Cl.$^6$ ............... H04L 7/04; H04L 27/16; H04L 27/22
[52] U.S. Cl. ............... 375/344; 375/362; 370/210; 370/510
[58] Field of Search ............... 375/281, 316, 375/332, 339, 344, 345, 355, 362, 365; 329/306, 307, 308; 370/203, 210, 510–513

[56] References Cited

U.S. PATENT DOCUMENTS

| | | | |
|---|---|---|---|
| 4,599,732 | 7/1986 | LeFever | 375/346 |
| 5,550,812 | 8/1996 | Philips | 370/203 |
| 5,608,764 | 3/1997 | Sugita et al. | 375/344 |

FOREIGN PATENT DOCUMENTS

| | | | |
|---|---|---|---|
| 0441730 | 8/1991 | European Pat. Off. | H04L 5/06 |
| 0441731 | 8/1991 | European Pat. Off. | H04L 5/06 |
| 0529421 | 3/1993 | European Pat. Off. | H04L 5/06 |
| 41287134 | 3/1993 | Germany | H04B 17/02 |
| 8800417 | 1/1988 | WIPO | H04L 27/34 |
| 9216063 | 9/1992 | WIPO | H04J 11/00 |

OTHER PUBLICATIONS

"Digitale Fernsehübertragung" by Dr.–Ing. Rüdiger Kays, in: Fernseh–Und Kino–Technik, vol. 46, No. 9, 1992, pp. 599–570.

"Digital Sound Broadcasting to Mobile Receivers" by Le Floch et al., in: IEEE Transactions on Consumer Electronics, vol. 35, No. 3, 1989, pp. 493–503.

"Analysis and Simulation of a Digital Mobile Channel Using Orthogonal Frequency Division Multiplexing" by L.J. Cimini, Jr. in: IEEE Transactions on Communications, vol.33,No.7, 1985, pp. 665–675.

"OFDM/FM Frame Synchronization for Mobile Radio Data Communication" by W.D. Warner and C.Leung, in: IEEE Transactions on Vehicular Technology, vol.42,No.3,1993, pp.302–313.

Primary Examiner—Young T. Tse
Attorney, Agent, or Firm—Paul J. Vincent

[57] ABSTRACT

Multi-channel transmission systems make great demands on the adjustment of the local oscillators in order to minimize carrier frequency variations on the transmission and reception sides. There are prior art processes and arrangements in which the local oscillators are adjusted by means of a synchronism word. The prior art processes and arrangements, however, have the drawback that the oscillators cannot be adjusted accurately enough. The present invention overcomes this drawback in that, in addition to the known synchronism symbols, other synchronism symbols are used and the synchronism symbols are evaluated with increased spectral resolution.

8 Claims, 3 Drawing Sheets

PROCESS AND ARRANGEMENT FOR ADJUSTING THE LOCAL OSCILLATORS OF A RECEIVER IN A MULTI-CHANNEL TRANSMISSION SYSTEM

BACKGROUND OF THE INVENTION

The invention concerns a method and an arrangement for adjusting the local oscillators of a receiver in a multi-channel transmission system with which a coarse and fine synchronization of the oscillators is effected by means of known synchronism symbols in the receiver.

Multi-channel transmission systems utilized, among other things, for the digital transmission of radio signals, are known in the art as DAB (Digital Audio Broadcast). The multi-channel transmission system thereby used exercises the COFDM method (Coded Orthogonal Frequency Division Multiplex). Furthermore, known in the art from the publication "Digitale Fernseh übertragung—Systemkonzepte und Einführungschancen" ["Digital Television Transmission System Concepts and Introduction Opportunities"] by R. Kays, published in Fernseh- and Kino-Technik [Television and Movie Technology], No. 9/1992, pages 559–570, is the fact that multi-channel transmission systems based on the OFDM or COFDM method can also be used for realizing a digital terrestrial television system.

In a multi-channel transmission system for digital data transmission the data stream to be transmitted is divided into a plurality (several hundred to several thousand) of subcarriers which are adjacent to each other in frequency, whereby the spectra of the subcarriers can also overlap each other. By means of this procedure a data rate is transmitted for each subcarrier which is orders of magnitude lower than the original data rate, as a result of which, the symbol duration correspondingly increases. This is advantageous in the event that echoes occur on the transmission channel. By means of a suitable determination of the number of subcarriers it is always possible to configure a multi-channel transmission system in such a fashion that the symbol duration is large compared to the expected echo time.

The influence of echoes with certain echo times can be completely removed, in the event that the symbols are not transmitted in direct sequence rather when, in each case, a protection time is provided for between two sequential symbols, during which the echoes of the initially transmitted symbol die-off.

Additional disrupting influences in the transmission channel can be reduced in that the time and/or frequency sequence of the information to be transmitted is scrambled.

The modulation of the transmission signal in a multi-channel transmission system can advantageously be effected by means of an inverse fast Fourier transformation (IFFT), whereby the number of values to be transformed is given by the number of subcarriers. The multi-channel modulation signal is divided into time-frequency slots. The time slots are formed by the discrete symbol cycle and the frequency slots by the frequency separation of the subcarriers. The demodulation of the multi-channel modulation signal on the receiver side can also advantageously be effected by means of fast Fourier transformation (FFT).

A more detailed description of multi-channel transmission systems according to the OFDM or COFDM methods can be found, for example, in laid open publication WO 88/00417 or in the publication "Digital Sound Broadcasting to Mobile Receivers", IEEE Transactions on Consumer Electronics, Vol. 35, No. 3, August 1989, pages 493–503 the contents of which is hereby incorporated by reference.

Data transmission in multi-channel tranmission methods in accordance with the OFDM method is effected in a frame oriented fashion. Each frame begins with a zero-symbol which serves the purpose of identifying the beginning of the frame and for time synchronization. Synchronism symbols and the data symbols carrying the information then follow.

The OFDM method requires that the carrier frequency of the transmitter and receiver coincide very precisely. The tolerable deviation is determined by the frequency separation of the subcarriers and the complexity of the modulation of the individual subcarriers. The requirements increase rapidly when the modulation of the subcarriers is effected, for example, with a 64 QAM (quadrature amplitude modulation) instead of a 4 PSK (phase shift keying).

Subsequent to the receiver sided Fourier transformation and due to deviations in the carrier frequencies between the transmitter and receiver, phase disturbances, amplitude distortions and disruptions by interferences are present, e.g. additional spectral components occur. FIGS. 2a,b illustrate these relationships.

In order to control the local oscillators of the receiver and to compensate for deviations in the carrier frequency on the receiver side, the utilization of the above mentioned synchronism symbol is, for example, known in the art from European laid open publication EP 0 441 730 A1. The synchronism symbol is a transmitter symbol which is known in the receiver and which comprises subcarriers only at particular locations within the synchronism symbol. The remaining subcarriers are suppressed. When receiving the synchronism symbol, in addition to the main spectral component whose amplitude is attenuated with respect to the transmitted subcarriers, additional spectral components occur due to the described interferences and disruptions. By determining the main spectral component it is possible to determine the deviation of the carrier frequencies and the local oscillators can be adjusted correspondingly. In addition to the transmission of the synchronism symbol at the beginning of the frame it is also possible to repeat that symbol during the frame to thereby facilitate a continuous control of the oscillators.

It is furthermore known in the art that by evaluating the additional spectral components which are present following the Fourier transformation at separations from the subcarriers, a more precise determination of the deviation of the carrier frequencies is possible. This is achieved by interpolation of the additional spectral components which as represented in FIG. 2b, have the overall dependence of an integral sine function.

Known in the art from German laid open publication DE 41 28 713 A1 is a method and an arrangement for the measurement of carrier frequency shift in a multi-channel transmission system with which a synchronism symbol is utilized at the beginning of the frame, whereby the frequency shift is determined by means of correlation. Towards this end, in a first step, a coarse measurement of the frequency deviation is carried out with the order of magnitude of the subcarrier frequency separation. In a second step a fine measurement is carried out which is precise to a fraction of a subcarrier frequency separation. The documents provides no indication for a continuous measurement.

The conventional method is disadvantageous insofar that the determination of the carrier frequency deviation cannot be carried out to arbitrary precision which is particularly desirable with the increase in complexity of carrier modulation. Furthermore, in the event of small deviations of the receiver oscillators, the additional spectral components are so small that they can be covered up by interferences, as a result of which a precise synchronization by means of interpolation of the dependence of the integral sine function is impossible. A further disadvantage is caused by the fact that, for a continuous determination of the carrier frequency deviation, is necessary to transmit a plurality of conventional synchronism symbols within one frame as a result of which the entire transmittable amount of data is reduced.

It is therefore the purpose of the present invention to introduce a method and an arrangement for the adjustment of local oscillators of a receiver in a multi-channel transmission system with which the disadvantages of prior art are avoided.

SUMMARY OF THE INVENTION

This purpose is achieved in accordance with the invention by a method for adjustment of local oscillators of a receiver in a multi-channel transmission system, with which a coarse and a fine synchronization of the oscillators using known receiver synchronism symbols is carried out, wherein a first synchronism symbol (AFC) at the beginning of each frame as well as additional synchronism symbols (FS) in subsequent data symbols are utilized. The method is characterized in that, the additional synchronism symbols (FS) have a smaller spectral width than the first synchronism symbol (AFC) and are only used for fine synchronization and the synchronism symbols (AFC; FS) are analyzed with a higher spectral resolution for fine synchronization than for coarse synchronization. The purpose is also achieved by an apparatus for adjusting the local oscillators of a receiver in a multi-channel transmission system, with which a coarse and a fine synchronization of the oscillators is effected using conventional receiver synchronism symbols, wherein a first synchronism symbol (AFC) at the beginning of a frame, as well as additional synchronism symbols (FS) within the subsequent data symbols are utilized. The apparatus comprises:

- a first local oscillator and a first mixer for the production of an intermediate frequency signal from a high frequency signal;
- a second local oscillator and a second mixer for producing two basis band signals in quadrature phase relationship;
- analog to digital converters for digitizing the quadrature phase relationship signals;
- a device for Fourier transforming the digital signals, with which the number of Fourier transformation values is equal to the number of subcarriers utilized in the multi-channel transmission system; and
- a device for coarse synchronization of at least one of the local oscillators in accordance with the analysis of the first synchronism symbol characterized in that a device for fine synchronization is present, which analyzes first (AFC) as well as additional synchronism symbols (FS), the device for fine synchronization comprising a component for Fourier transformation of the synchronism symbols (AFC; FS), wherein the number of Fourier transformation values in the frequency range occupied by the additional synchronism symbols (FS) is larger than the number of subcarriers.

The advantages of the invention lie particularly therein, that a continuous adjustment of the local oscillators of the receiver is possible, the precision of which is thereby adaptable to the requirements of the corresponding multichannel transmission system, in that the number of values to be determined for evaluating the synchronism symbol by means of a Fourier transformation can be specified in such a fashion that more values can be determined than there are subcarriers in a particular frequency region.

An additional advantage is the utilization of special synchronism symbols for the continuous fine synchronization as a result of which an improved spectral utilization of the transmission channel is achieved.

Further configurations and advantages of the invention result from the dependent claims and the subsequent description of the invention in relation to the figures.

DESCRIPTION OF THE PREFERRED EMBODIMENT

Figure 1:
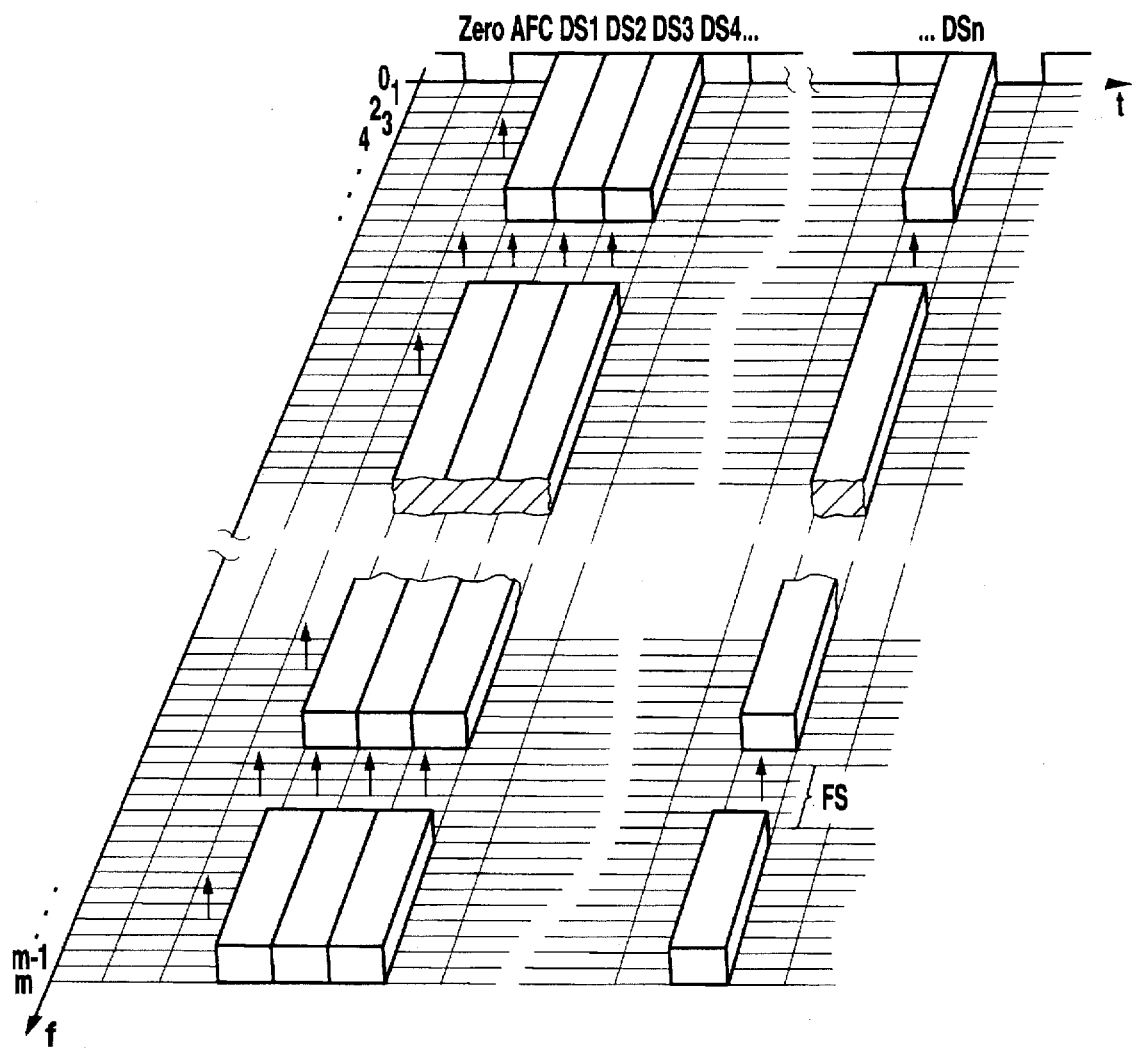
FIG. 1 shows a representation of an exemplary frame of the transmitter signal forming the basis of the method in accordance with the invention in the time-frequency plane.

The exemplary frame of the multi-channel signal represented in the time-frequency plane in FIG. 1 exhibits, at the beginning, a zero-symbol zero. Following same is a synchronism symbol AFC as well the data symbols DS1 through DSn. In the example shown, the signal is divided into m+1 subcarriers. The synchronism symbol AFC comprises subcarriers of constant amplitude which exhibit a separation from each other of eight subcarriers in each case. Subcarriers lying therebetween are suppressed. By means of the selection of the separation between the subcarriers of constant amplitude the correction region within which the frequency deviations of the receiver oscillators can be compensated for is defined. In the present example this correction region assumes a value of ±three subcarrier frequency separations. With larger frequency deviations an overlapping of the above described additional spectral components occurs as a result of which a unique determination of the actual frequency deviation is no longer possible. When the separation between the non-suppressed subcarriers is increased, the correction region increases correspondingly, by way of example up to ±15 subcarrier frequency separations for a separation of 32 subcarriers.

The synchronization of the local oscillators in accordance with the invention will be subsequently described based on the section of the synchronism symbol AFC represented in FIGS. 2a, 2b, and 2c.

Figure 2A:
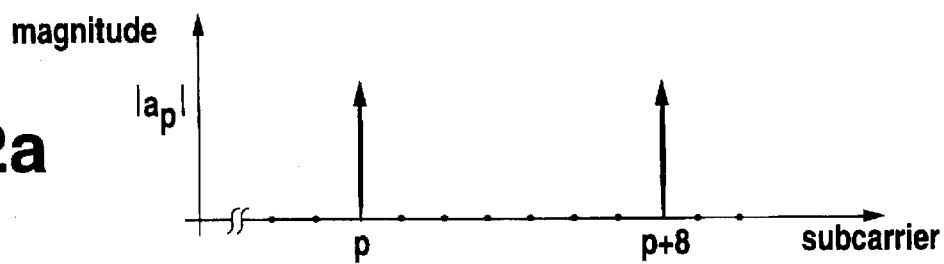
FIG. 2a shows the representation of a section of an exemplary synchronism symbol in the frequency region.

FIG. 2a represents the synchronism symbol AFC radiated by the transmitter. Since the precise position of the subcarriers in the synchronism symbol AFC is assumed to be known at the receiver side, it is possible to adjust the local oscillators with the spectrum produced in the receiver by means of Fourier transformation. It is advantageous to utilize the fast Fourier transformation (FFT). The number of values of Fourier transformation is given by the number of subcarriers. In the event that there is no frequency shift between the subcarrier frequencies on the transmitting and receiving sides, the spectrum produced in the receiver corresponds to the spectrum radiated by the synchronism symbol AFC. Subcarriers occur only at the known locations and an adjustment of the local oscillators is not necessary.

Figure 2B:
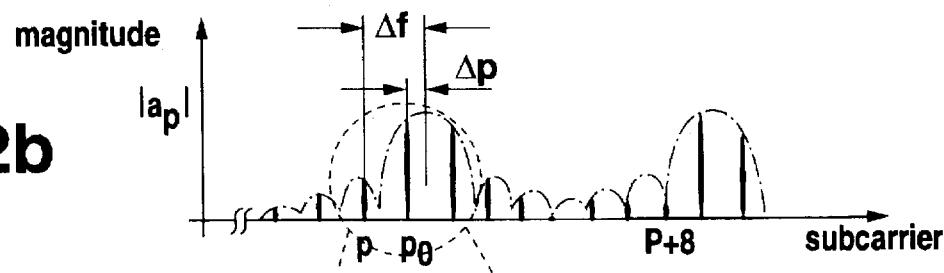
FIG. 2b shows the spectral representation of the section of the exemplary synchronism symbol after reception in the event of a carrier frequency deviation in the receiver.
Figure 2C:
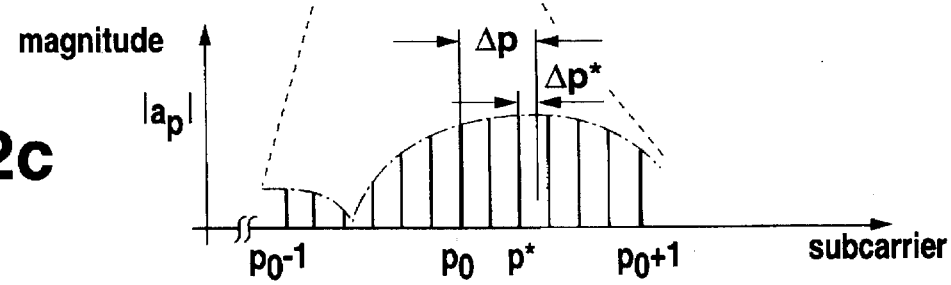
FIG. 2c shows the spectral representation of a six-fold increased resolution utilized for fine synchronization.

FIG. 2b represents the spectrum of the synchronism symbol AFC produced in the receiver for the case of a frequency shift Δf. The spectrum exhibits, in addition to a main component at the position $p_0$, additional components at the other subcarrier locations. For coarse synchronization of the local oscillators the main spectral component at the position $p_0$ is evaluated in that the amplitude of greatest magnitude is determined. The precision achievable with the coarse synchronization is in the range of a half of a subcarrier frequency separation.

After the coarse synchronization of the local oscillators has taken place a fine synchronization is carried out based on the determined location $p_0$ in order to reduce the remaining frequency deviation Δp represented in FIG. 2b. Towards this end the spectral resolution is increased as shown in FIG. 2c. The increase in the spectral resolution occurs in accordance with the invention in that an additional Fourier transformation is carried out with which, only for the frequency range of the additional synchronism symbols FS, more values are calculated than there are available subcarriers. In the example shown in accordance with FIG. 2c six times the number of values are calculated and the location p* is determined for the main spectral component. The frequency deviation Δp* which thereby results is correspondingly reduced to one sixth. In this manner the determination of the frequency deviation to be adjusted is thereby likewise effected by determination of the amplitude value of largest magnitude.

In order to achieve the desired precision for the fine synchronization, the number of values calculated in the additional Fourier transformation is correspondingly increased.

The initial values which are necessary for calculating the additional Fourier transformation can be most easily produced by means of "zero padding". Towards this end the missing values for the Fourier transformation are set to zero. A more detailed description of "zero padding" can be found, for example, in "Digitale Signalverarbeitung" [Digital Signal Processing"] by K. Kammeyer and K. Kroschel, appearing in Teubner-Verlag, Stuttgart, 1989 the contents of which is hereby incorporated by reference.

In principle, the evaluation of only one of the non-suppressed subcarriers is sufficient for the fine synchronization. In order to reduce the susceptibility to interference it is, however possible, to evaluate a plurality of subcarriers within one synchronism symbol AFC in accordance with the described procedure and to determine the subcarrier frequency deviations Δp* by means of an averaging of each individually determined subcarrier frequency deviation.

In order to enable synchronization of the local oscillators not only at the beginning of the frame by means of the synchronism symbol AFC, additional synchronism symbols FS are introduced into the data symbols. In this fashion a continuous fine synchronization is possible. The additional synchronism symbols FS can exhibit a substantial smaller spectral width than the synchronism symbol AFC, since, by means of the coarse synchronization, a reduction of frequency deviation to one half of the subcarrier frequency separation has already been achieved. Therefore, within the context already described above, it is sufficient when the additional synchronism symbols FS are formed from a subcarrier of constant amplitude which is surrounded, in each case, by two suppressed subcarriers. Therefore only five subcarriers are necessary for each of the additional synchronism symbols FS. Differing larger synchronism symbols FS are possible.

In order to carry out the fine synchronization in accordance with the invention it is sufficient to introduce one of the additional synchronism symbols FS into each data symbol. In order to reduce interferences it is, however, reasonable to provide for a plurality of synchronism symbols FS in each data symbol (FIG. 1) and, as described above, carry out an averaging.

Depending on the time requirements for continuity of the fine synchronization the additional synchronism symbols FS can be introduced into each data symbol or at an arbitrary separation from data symbols.

Figure 3:
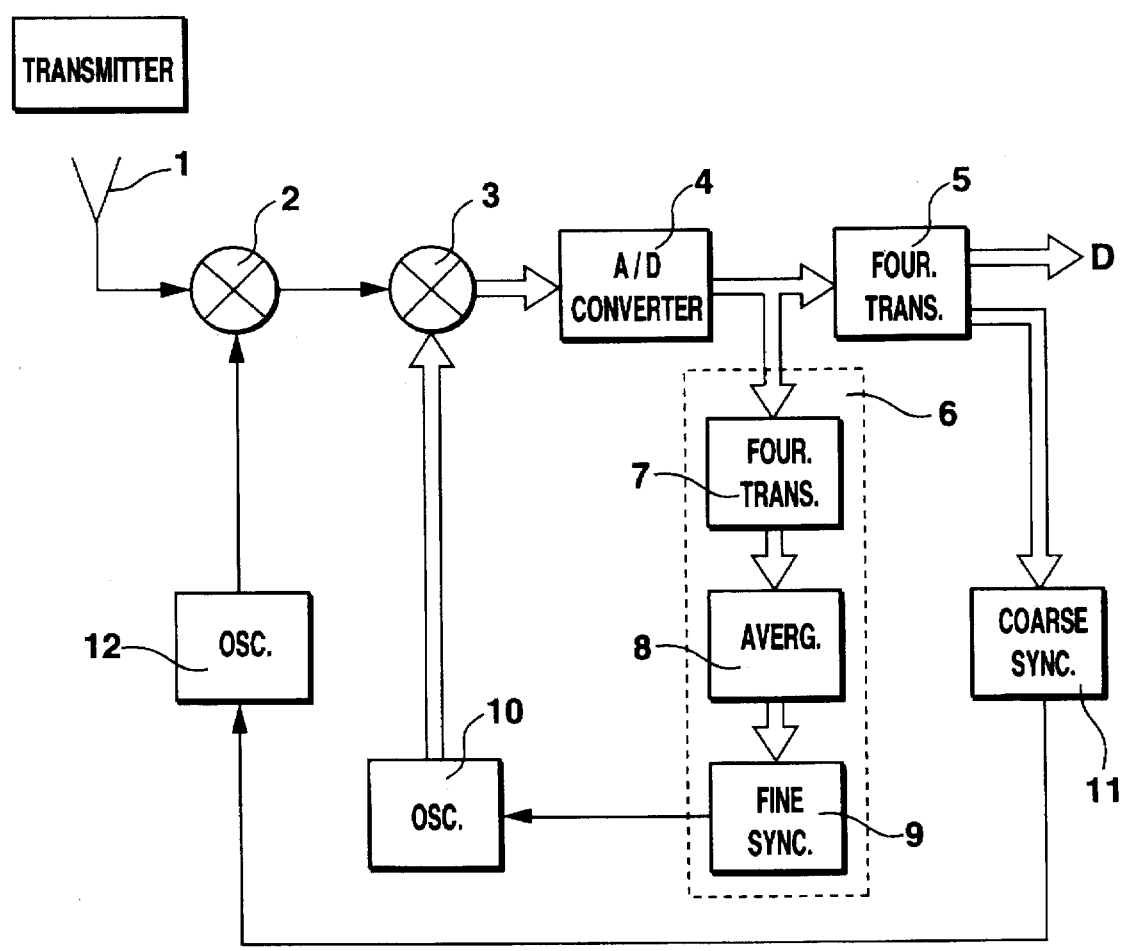
FIG. 3 shows an embodiment of a receiver in accordance with the invention.

FIG. 3 represents an embodiment in accordance with the invention of a receiver for carrying out the above described method. For purposes of simplicity, only components essential to the invention are represented.

The high frequency multi-channel signals are received via antenna 1 and are brought into an intermediate frequency position by means of a mixer 2 as well as a first local oscillator 12. The intermediate frequency signal is present at a second mixer 3 at the second input of which a second local oscillator 10 is applied. The mixer/oscillator combination 3, 10 executes a complex mixing of the intermediate frequency signal. After mixer 3 two basis band signals are available in quadrature phase relationship which are digitized in an analog/digital converter 4.

The signals are subsequently Fourier transformed 5, whereby the number of values to be determined is specified by the number of subcarriers forming the multi-channel signal. The best way to realize the Fourier transformer 5 is by means of a fast Fourier transformation. The received data are available for further processing at the output D of the Fourier transformer 5. By means of the second output, the signal gained by means of the synchronism symbol AFC is available for coarse synchronization at the device 11.

The amplitude of the signals is evaluated in device 11 and a maximum search is carried out in order to determine the main spectral component. By comparing the position of the determined main spectral component to the known synchronism symbol AFC the current frequency deviation of the subcarrier is determined. In the case of coarse synchronization the frequency deviation determined is always a whole number multiple of the subcarrier frequency separation. The device for coarse synchronization produces a control signal based on the described analysis with which the local oscillator 12 is controlled.

A device 6 is available for fine synchronization which evaluates the additional synchronism symbols FS present in the data symbols. Towards this end, by means of a Fourier transformer 7, a fast Fourier transformation for the frequency range is carried out which incorporates the additional synchronism symbols FS and a larger number of values is calculated than there are subcarriers in the multi-channel signal. The frequency deviation determined for each of the synchronism symbols FS present in a data symbol are averaged in a device 8. A device 9 for determination of a maximum and the production of a control signal for fine synchronization of the local oscillators 10 follow. With the fine synchronization, frequency deviations are determined and compensated for which correspond to a fraction of a subcarrier frequency separation.

For subsequent frames the current frequency deviation is checked via the coarse synchronization 11. In the event that the determined deviation is smaller than a subcarrier frequency separation the local oscillator 12 is not adjusted. In this case the synchronism symbol AFC can also be utilized for fine synchronization. In order to control this interaction between coarse and fine synchronization an additional device is present which is not shown in FIG. 3. In addition, a device which is not shown is present downstream of the analog/digital converter 4 which serves for normalization of the synchronism symbol. This normalization is necessary since the amplitudes of the subcarriers in the synchronism symbols exhibit differing values and the entire multi-channel signal should exhibit an even spectral energy distribution. This would not occur for equal amplitudes of all non-suppressed subcarriers due to the suppressed subcarriers in the synchronism symbols.

The proposed division for the regulation of carrier frequency separations at both local oscillators is particularly advantageous since the requirements for controllability of the oscillators are modest. Other embodiments are, however, easily possible.

I claim:

1. A method for synchronizing local oscillators of a receiver in a multi-channel transmission system comprising the steps of:

transmitting and receiving a first synchronism symbol at the beginning of a transmission frame;

transmitting and receiving additional synchronism symbols in data symbols subsequent to the first synchronism signal, the additional synchronism symbols having a spectral width which is smaller than a spectral width of the first synchronism symbol;

analyzing the first synchronism symbol with a first spectral resolution;

analyzing the additional synchronism symbols with a second spectral resolution, the second spectral resolution being higher than the first spectral resolution;

coarse synchronizing one of the oscillators using the first synchronism symbol; and fine synchronizing one of the oscillators using the additional synchronism symbols.

2. The method of claim 1, wherein the additional synchronism symbols comprise a subcarrier of constant amplitude and further comprising the steps of suppressing a first subcarrier occurring before the constant amplitude subcarrier and suppressing a second subcarrier occurring after the constant amplitude subcarrier.

3. The method of claim 1, wherein a plurality of additional synchronism symbols are transmitted and received in one data symbol and further comprising the step of averaging individual analyzed values of the additional synchronism symbols to fine synchronize one of the oscillators.

4. The method of claim 1, wherein the first synchronism symbol is analyzed by Fourier transformation with a first number of transformation values equal to a number of subcarriers in the multi-channel transmission system and wherein the additional synchronism symbols are analyzed by Fourier transformation to calculate, within a frequency region occupied by the additional synchronism symbols, a second number of transformation values which is larger than the number of subcarriers to increase the second spectral resolution relative to the first spectral resolution.

5. The method of claim 4, wherein the second number of transformation values is calculated using zero padding.

6. An apparatus for synchronizing local oscillators of a receiver in a multi-channel transmission system, the system sending and receiving a first synchronism symbol at the beginning of a frame and additional synchronism Symbols in subsequent data symbols, the additional synchronism symbols having a spectral width smaller than a spectral width of the first synchronism symbol, the system comprising:

a first mixer having a radio frequency input and a first mixer output;

a first local oscillator connected to the first mixer for producing an intermediate frequency signal at the first mixer output;

a second mixer connected to the first mixer output and having a second mixer output;

a second local oscillator connected to the second mixer for producing two basis band signals in quadrature phase relationship at the second mixer output;

an analog to digital converter connected to the second mixer output for digitizing the two basis band signals;

a first Fourier transform device connected to the analog to digital converter for producing a first number of Fourier transformation values equal to a number of subcarriers in the multi-channel transmission system;

a device for coarse synchronization connected to the first Fourier transform device and to at least one of the first and the second local oscillators for coarse synchronization based on an analysis of the first synchronism symbol; and a device for fine synchronization connected to the analog to digital converter and comprising a second Fourier transform device for producing a second number of Fourier transformation values in a frequency range occupied by the additional synchronism symbols, the second number being larger than the number of subcarriers, the fine synchronization device analyzing the first as well as the additional synchronism symbols, the fine synchronization device connected to at least one of the first and second local oscillators for fine synchronization.

7. The apparatus of claim 6, wherein the device for fine synchronization comprises means for averaging a plurality of fine synchronization values.

8. The apparatus of claim 6, wherein the coarse synchronization device is connected for regulation of the first local oscillator and the fine synchronization device is connected for regulation of the second local oscillator.

* * * * *

UNITED STATES PATENT AND TRADEMARK OFFICE
CERTIFICATE OF CORRECTION

PATENT NO. : 5,692,016
DATED : November 25, 1997
INVENTOR(S) : Frank VANSELOW

It is certified that error appears in the above-indentified patent and that said Letters Patent is hereby corrected as shown below:

On title page of patent number 5,692,016 please replace "Grundig E.M.V., Elektromechanische Versuchsanstalt Max Grundig GmbH Co. KG, Fuerth, Germany" with --GRUNDIG AG, Fuerth, Germany--

Signed and Sealed this

Twenty-third Day of June, 1998

Attest:

BRUCE LEHMAN

*Attesting Officer*    *Commissioner of Patents and Trademarks*